(12) United States Patent
Tavkhelidze et al.

(10) Patent No.: US 7,169,006 B2
(45) Date of Patent: Jan. 30, 2007

(54) THERMIONIC VACUUM DIODE DEVICE WITH ADJUSTABLE ELECTRODES

(75) Inventors: Avto Tavkhelidze, Tbilisi, GA (US); Zaza Taliashvili, Tbilisi, GA (US)

(73) Assignee: Borealis Technical Limited (GI)

(*) Notice: Subject to any disclaimer, the term of this patent is extended or adjusted under 35 U.S.C. 154(b) by 56 days.

(21) Appl. No.: 10/507,273

(22) PCT Filed: Mar. 6, 2003

(86) PCT No.: PCT/US03/07015

§ 371 (c)(1),
(2), (4) Date: Sep. 3, 2004

(87) PCT Pub. No.: WO03/090245

PCT Pub. Date: Oct. 30, 2003

(65) Prior Publication Data

US 2005/0104512 A1  May 19, 2005

Related U.S. Application Data

(60) Provisional application No. 60/373,508, filed on Apr. 17, 2002, provisional application No. 60/362,494, filed on Mar. 6, 2002, provisional application No. 60/316,918, filed on Sep. 2, 2001.

(51) Int. Cl.
*H01J 9/00* (2006.01)
*H02N 10/00* (2006.01)
*F25B 21/00* (2006.01)
(52) U.S. Cl. .............................. 445/67; 310/306; 62/3.1
(58) Field of Classification Search ................ 313/310; 438/141, 380; 62/3.2, 3.3, 3.1; 310/306; 136/230, 200, 205; 445/67
See application file for complete search history.

(56) References Cited

U.S. PATENT DOCUMENTS

| 3,600,933 | A | * | 8/1971 | Johnston ...................... 374/23 |
| 3,740,592 | A | | 6/1973 | Engdahl et al. |
| 4,011,582 | A | | 3/1977 | Cline et al. |
| 4,039,352 | A | | 8/1977 | Marinescu |
| 4,063,965 | A | | 12/1977 | Cline et al. |
| 4,880,975 | A | * | 11/1989 | Nishioka et al. ............ 250/306 |
| 5,336,547 | A | | 8/1994 | Kawakita et al. |
| 5,675,972 | A | | 10/1997 | Edelson |

(Continued)

FOREIGN PATENT DOCUMENTS

WO    WO 99/13562 A1    3/1999

OTHER PUBLICATIONS

Fitzpatrick, G.O.; Koester, J.K.; Chang, J.; Britt, E.J.; McVey, J.B.; "Close-Spaced Thermionic Converters with Active Spacing Control and Heat-Pipe Isothermal Emitters," 1996, IEEE pp. 920-927.*

*Primary Examiner*—Mariceli Santiago
*Assistant Examiner*—Anne M Hines

(57) ABSTRACT

In accordance with one embodiment of the present invention, a Gap Diode is disclosed in which a tubular actuating element serves as both a housing for a pair of electrodes (92) and as a means for controlling the separation between the electrode pair. In a preferred embodiment, the tubular actuating element (90) is a quartz piezo-electric tube. In accordance with another embodiment of the present invention, a Gap Diode is disclosed which is fabricated by micromachining techniques in which the separation of the electrodes (202, 206) is controlled by piezo-electric, electrostrictive or magnetostrictive actuators. Preferred embodiments of Gap Diodes include Cool Chips, Power Chips, and photoelectric converters.

13 Claims, 7 Drawing Sheets

U.S. PATENT DOCUMENTS

| | | |
|---|---|---|
| 5,699,668 A | 12/1997 | Cox |
| 5,722,242 A | 3/1998 | Edelson |
| 5,917,156 A | 6/1999 | Nobori et al. |
| 5,994,638 A * | 11/1999 | Edelson ............ 136/205 |
| 6,214,651 B1 | 4/2001 | Cox |
| 6,225,205 B1 | 5/2001 | Kinoshita |
| 6,232,546 B1 * | 5/2001 | DiMatteo et al. ........... 136/253 |
| 6,417,060 B2 | 7/2002 | Tavkhelidze et al. |
| 6,869,855 B1 * | 3/2005 | Tavkhelidze et al. ....... 438/380 |
| 2001/0046749 A1 | 11/2001 | Tavkhelidze et al. |
| 2003/0068431 A1 | 4/2003 | Taliashvili et al. |

* cited by examiner

THERMIONIC VACUUM DIODE DEVICE WITH ADJUSTABLE ELECTRODES

This application is the U.S. national stage application of International Application PCT/US03/07015, filed Mar. 6, 2003, which international application was published on Oct. 30, 2003, as International Publication WO03090245 in the English language. The International Application claims the benefit of U.S. Provisional Application No. 60/362,494, filed Mar. 6, 2002, and U.S. Provisional Application No. 60/373, 508, filed Apr. 17, 2002. The International Application is related to co-pending U.S. patent application Ser. No. 10/234,498, filed 3 Sep. 2002, which claims the benefit of U.S. Provisional Application No. 60/316,918, filed 2 Sep. 2001. The above-mentioned patent applications are assigned to the assignee of the present application and are herein incorporated in their entirety by reference.

TECHNICAL FIELD

The present invention relates to diode devices, in particular, to diode devices in which the separation of the electrodes and the angle between the electrodes is set and controlled using piezo-electric, positioning elements. These include thermionic converters and generators, photoelectric converters and generators, and vacuum diode heat pumps. It is also related to thermotunnel converters.

BACKGROUND ART

The use of individual actuating devices to set and control the separation of the electrodes using piezo-electric, electrostrictive or magnetostrictive actuators in a gap diode is disclosed in WO99/13562. This avoids problems associated with electrode spacing changing or distorting as a result of heat is stress.

The use of composite materials as matching electrode pair precursors is disclosed in U.S. patent application Ser. No. 10/234,498. The approach comprises the steps of fabricating a first electrode with a substantially flat surface; placing over the first electrode a second material that comprises a material that is suitable for use as a second electrode, and separating the composite so formed along the boundary of the two layers into two matched electrodes.

Definitions:

"Power Chip" is hereby defined as a device which uses a thermal gradient of any kind to create an electrical power or energy output. Power Chips may accomplish this using thermionics, thermotunneling, or other methods as described in this application.

"Cool Chip" is hereby defined as a device which uses electrical power or energy to pump heat, thereby creating, maintaining, or degrading a thermal gradient. Cool Chips may accomplish this using thermionics, thermotunneling, or other methods as described in this application.

"Gap Diode" is defined as any diode which employs a gap between the anode and the cathode, or the collector and emitter, and which causes or allows electrons to be transported between the two electrodes, across or through the gap. The gap may or may not have a vacuum between the two electrodes, though Gap Diodes specifically exclude bulk liquids or bulk solids in between the anode and cathode. The Gap Diode may be used for Power Chips or Cool Chips, for devices that are capable of operating as both Power Chips and Cool Chips, or for other diode applications.

When surface features of two facing surfaces of electrodes are described as "matching," it means that where one surface has an indentation, the other surface has a protrusion and vice versa. Thus when "matched," the two surfaces are substantially equidistant from each other throughout their operating range.

DISCLOSURE OF INVENTION

From the foregoing, it may be appreciated that a need has arisen for an approach that provides devices that are simple to mass produce and operate.

In accordance with one embodiment of the present invention, a Gap Diode is disclosed in which a tubular actuating element serves as both a housing for a pair of electrodes and as a means for controlling the separation and angle between the electrode pair. In a preferred embodiment, the tubular actuating element is a quartz piezo-electric tube.

Preferred embodiments of Gap Diodes include Cool Chips, Power Chips, and photoelectric converters.

It is another technical advantage of the present invention that utilization of a tubular actuating element to control the separation of the electrodes overcomes flexing and buckling of the electrodes caused by high thermal stresses resulting from the temperature differences between the emitter electrode and the collector electrode.

It is a further technical advantage of the present invention that a tubular actuating element serves as a mechanical connector between electrodes, as an element that regulates the distance between the electrodes, and as vacuum sealing tube. This simplified construction brings together microelectronics techniques for fabricating the electrodes as a sandwich and MEMS techniques for attaching the sandwich to the actuator tube.

These devices overcome disadvantages of prior art systems such as economy and ease of fabrication and problems introduced by heat distortion at high temperature operation.

Other technical advantages of the present invention will be readily apparent to one skilled in the art from the following figures, description and claims.

BRIEF DESCRIPTION OF DRAWINGS

For a more complete understanding of the present invention and the technical advantages thereof, reference is made to the following description taken with the accompanying drawings, in which.

Best Mode for Carrying Out the Invention

The embodiments of the present invention and its technical advantages are best understood by referring to FIGS.

1–7. The present invention may be used in a number of devices, as stated herein, including, for example, (i) a device which uses a thermal gradient of any kind to generate electrical power or energy output using thermionics, thermotunneling, or other methods as described herein; (ii) a device which uses electrical power or energy to pump heat, thereby creating, maintaining, or degrading a thermal gradient using thermionics, thermotunneling, or other methods as described herein; and (iii) as any diode which employs a gap between the anode and the cathode, or the collector and emitter, and which causes or allows electrons to be transported between the two electrons, across or through the gap (with or without a vacuum in the gap). Alternatively, the device of the present invention may be integrated into or used for any ordinary diode applications.

Figure 1:
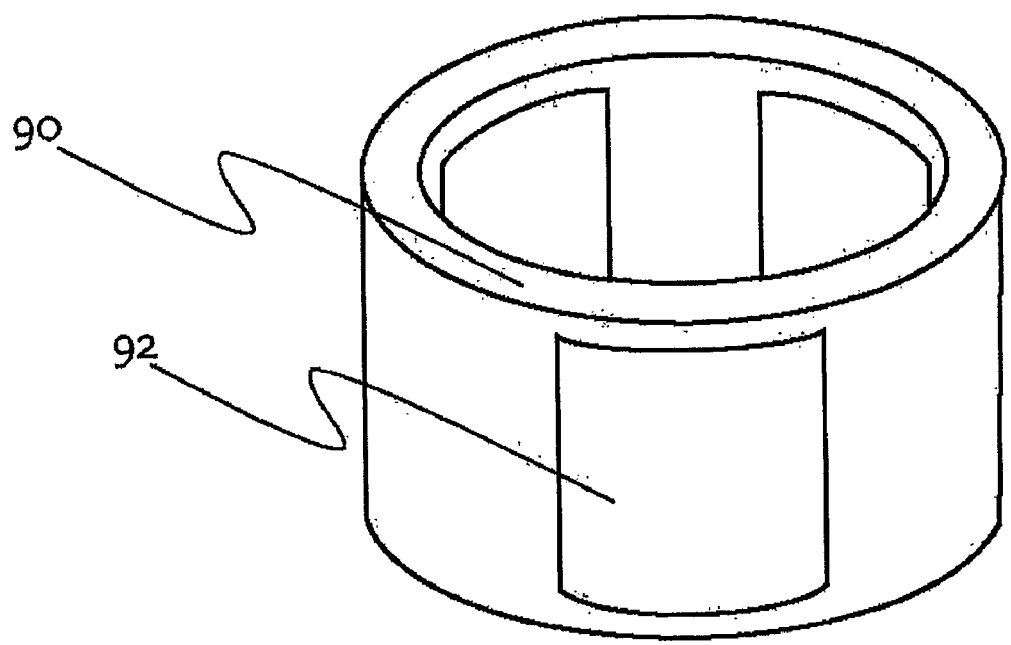
FIG. 1 is a diagrammatic representation of one embodiment of a tubular housing/actuator.
Figure 1:
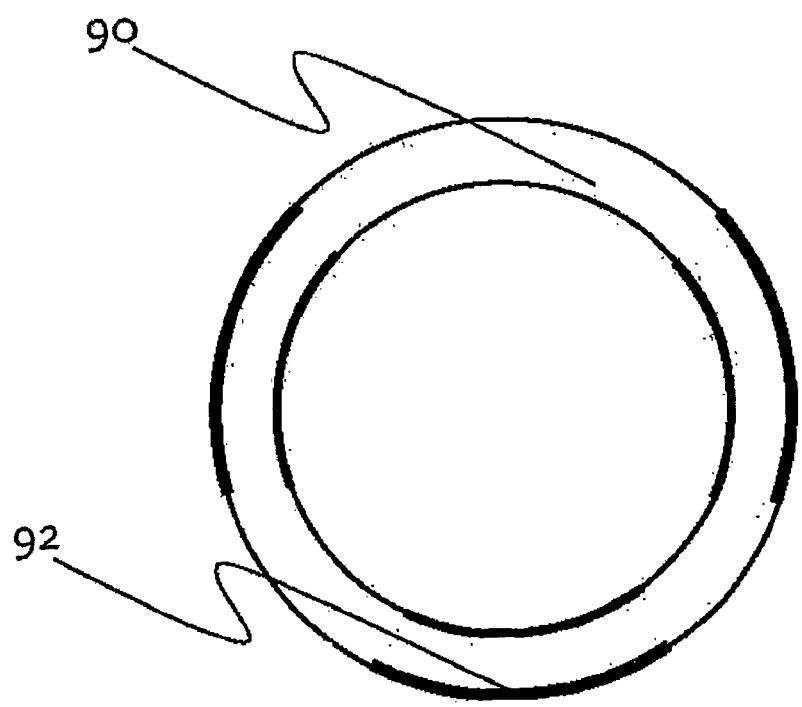

Referring now to FIG. 1, which shows a particularly preferred actuating element of the present invention, a tubular actuating element 90 has pairs of electrodes 92 disposed on its inner and outer surfaces for controlling the dimensions of the tubular element. FIG. 1 shows three such electrode pairs; fewer or more of such pairs may be present to control the dimensions of the tubular element. FIG. 1 shows electrodes disposed substantially over the length of the tube; electrodes may also be disposed over smaller areas of the tube to allow more or less local control of the dimensions of the tube. A variety of techniques may be used to introduce the pairs of electrodes onto the tubular element; by way of example only, and not to limit the scope of the invention, they may introduced by vacuum deposition, or by attaching a thin film using MEMS techniques. In a preferred embodiment, the actuating element is a piezo-electric actuator. In a particularly preferred embodiment, the actuator comprises quartz. The crystal orientation of the tube is preferably substantially constant, and may be aligned either parallel to, or perpendicular to the axis of the tube. Although FIG. 1 shows an actuator tube having an approximately circular cross-section, it is to be understood that other geometries are included within the scope of the invention. An electric field may be applied to actuating element 90 via connecting wires in an arrangement similar to that shown in FIG. 2, which causes it to expand or contract longitudinally. An advantage of such a tubular actuator is that it serves both as actuator and as housing simultaneously. Housing provides mechanical strength together with vacuum sealing. External mechanical shock/vibrations heat the external housing first, and are compensated immediately by actuator.

Figure 2:
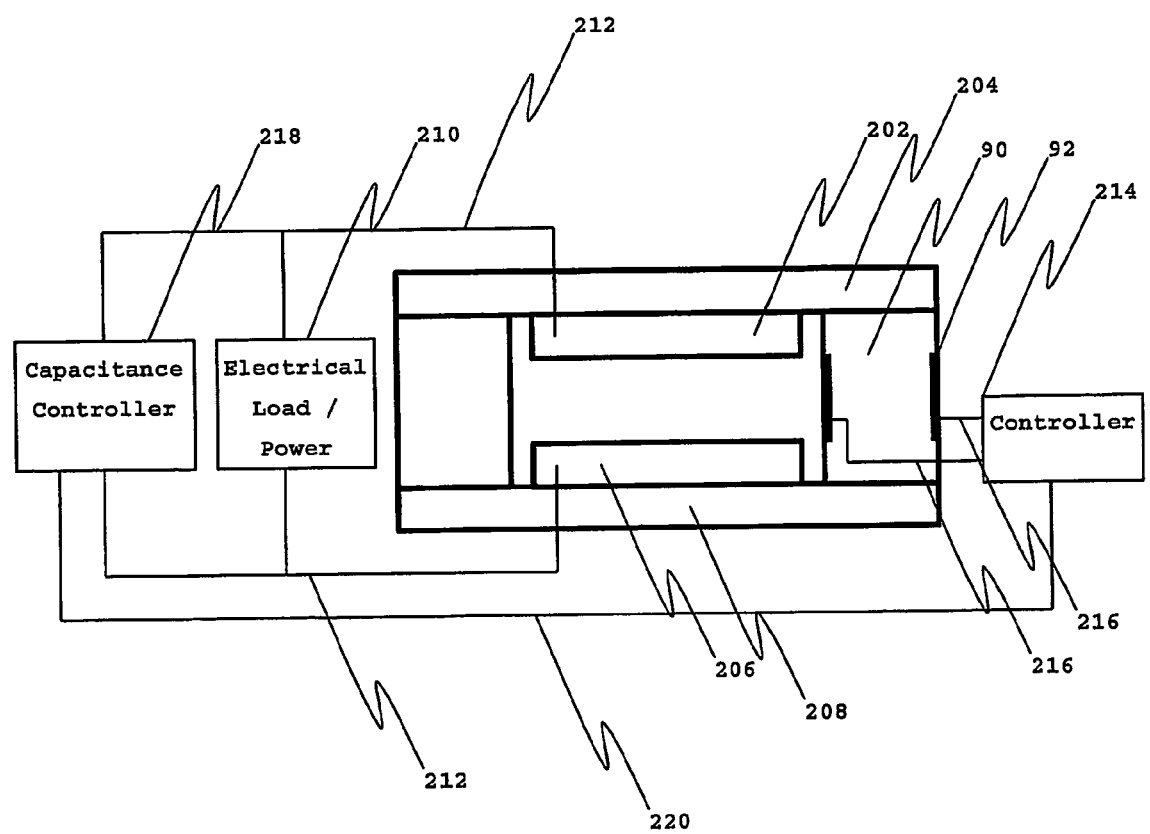
FIG. 2 is a schematic showing a diode device of the present invention.

Referring now to FIG. 2, which shows in a diagrammatic form a diode device of the present invention, a first electrode 202, disposed on substrate 204, is attached to the end of actuator tube 90, and a second electrode 206, disposed on substrate 208, is attached to the other end of tube 90. The two electrodes are also connected to an electrical load or power supply 210 by means of wires 212 (210 is an electrical load when the device is a heat energy to electrical energy converter, and is a power supply when the device is a heat pump). Actuator tube 90 has electrodes 92 disposed on its surface, as shown in FIG. 1, which are connected to controller 214 to via wires 216. This controller sets the separation of electrodes 202 and 206. Electrodes 202 and 206 may also be connected to capacitance controller 218 which is able to assess the separation of the electrodes, and the separation of the electrodes may be accurately controlled via a feedback loop 220 to controller 214. Typically, the electrode separation is of the order of 0.1 to 100 nm. In a further embodiment, electrode 202 and 206 may be formed from a matching electrode pair precursor, which is a composite that may be separated along a boundary between two different composite layers into two matched electrodes, as disclosed in U.S. patent application Ser. No. 10/234,498, and as illustrated in the Example below.

Figure 3:
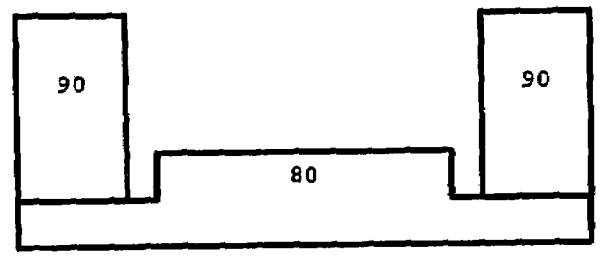
FIG. 3 is a schematic showing a process for the manufacture of a diode device having a tubular housing/actuator.
Figure 3:
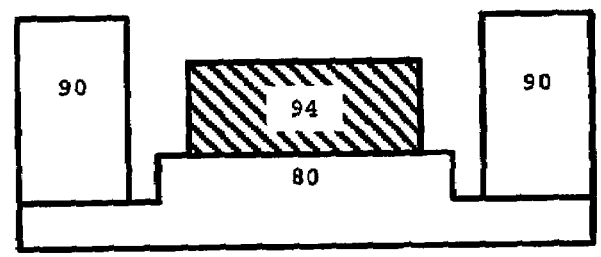
Figure 3:
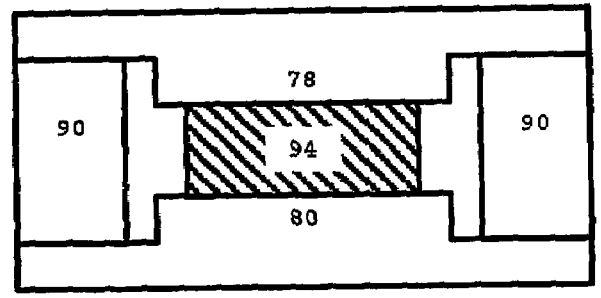
Figure 3:
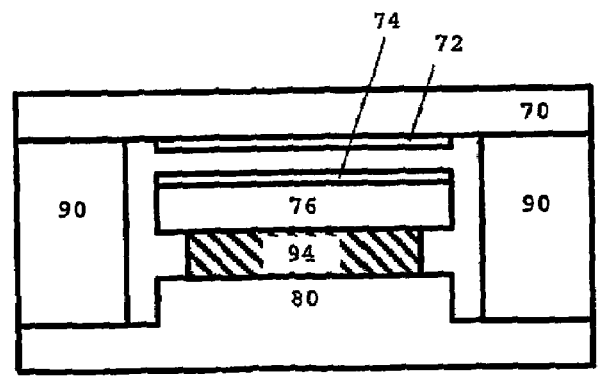

Referring now to FIG. 3, which depicts a schematic process for making a diode device of the invention and also shows a preferred embodiment of a diode device of the present invention, in step 300 a first composite 80 is brought into contact with a polished end of a quartz tube 90 of the sort shown in FIG. 1. Composite 80 is preferably a molybdenum disc, which has a similar thermal expansion coefficient as quartz and can be bonded to quartz. In step 310, an electrically conducting paste 94, preferably silver paste, is applied to the upper surface of the molybdenum disc, as shown. In step 320, the polished silicon periphery of the upper composite 78 is contacted with the other polished end of the quartz tube 90. Composite 78 is preferably a matching electrode pair precursor, such as the composite shown in step 130 of WO99/13562 or U.S. Pat. No. 6,417,060, or is more preferably the composite depicted in FIG. 4 (see also the Example), in which a layer of titanium 72 is deposited on substrate 70, and a layer of silver 74 is further deposited on the layer of titanium. A further layer of copper 76 is grown electrochemically on the layer of silver. Most preferably substrate 70 is a silicon wafer, and is polished at least around its periphery where it is in contact with tube 90. At the same time as the upper composite 78 is brought into contact with the end of the quartz tube, the electrically-conducting paste, preferably silver paste or liquid metal, contacts the upper composite as shown. High pressure is applied to this assemblage, which accelerates the chemical reaction between the polished silicon periphery of the composites and the polished ends of the quartz tube, bonding the polished surfaces to form the assemblage depicted in step 320. In step 330, the assemblage is heated, which causes the composite to open as shown, forming a pair of matching electrodes, 72 and 74.

Figure 5:
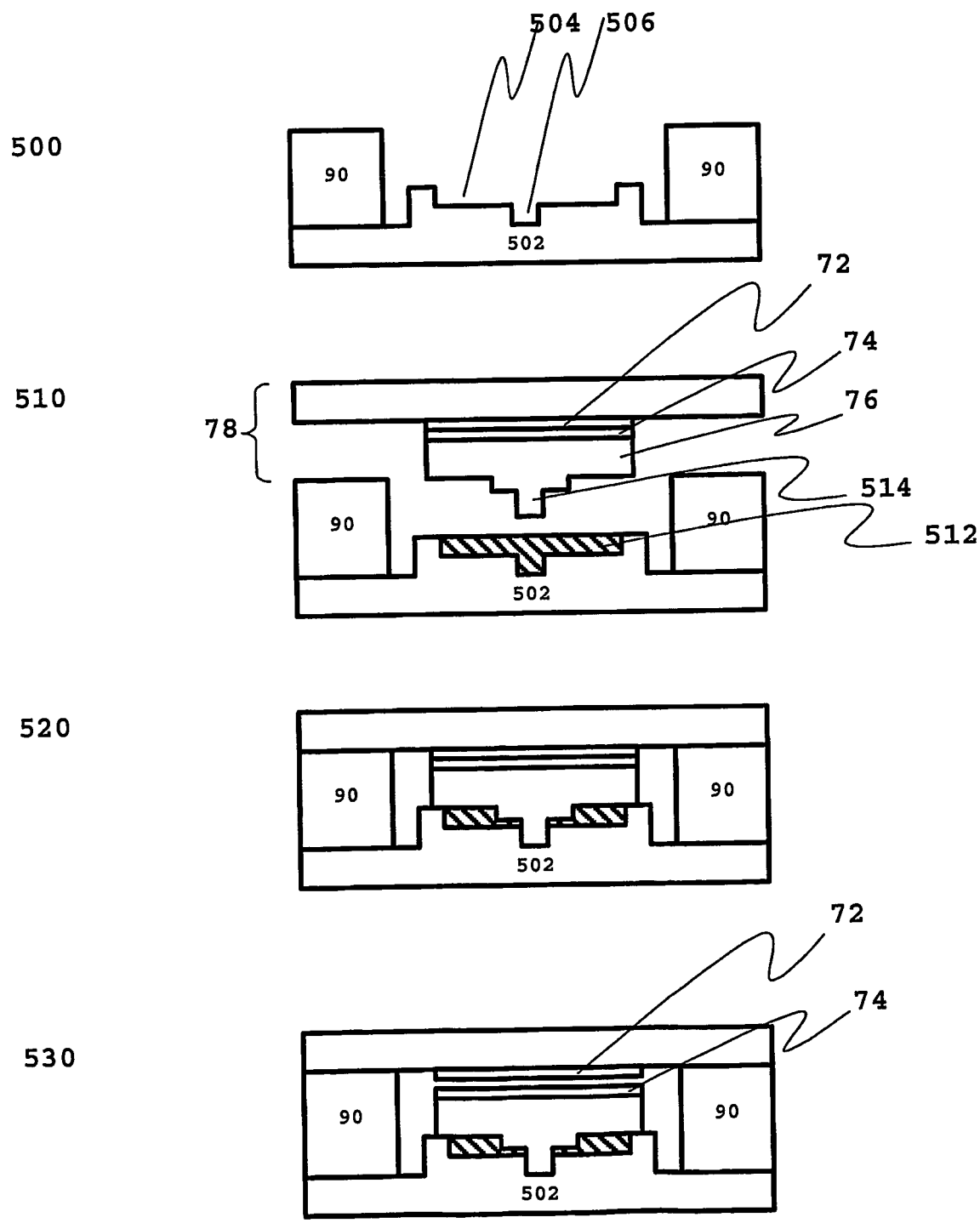
FIG. 5 is a schematic showing a process for the manufacture of a diode device having a tubular housing/actuator.

Referring now to FIG. 5, which depicts a further schematic process for making a diode device of the invention, in step 500 a first substrate 502 is brought into contact with a polished end of a quartz tube 90 of the sort shown in FIG. 1. Substrate 502 is any material which may be bonded to quartz, and which has a similar thermal expansion coefficient to quartz. Preferably substrate 502 is molybdenum, or silicon doped to render at least a portion of it electrically conductive. Substrate 502 has a depression 504 across part of its surface. Substrate 502 also has a locating hole 506 in its surface.

In step 510, liquid metal 512, is introduced into depression 502. The liquid metal is a metal having a high temperature of vaporization, and which is liquid under the conditions of operation of the device. The high temperature of vaporization ensures that the vapor from the liquid does not degrade the vacuum within the finished device. Preferably the liquid metal is a mixture of Indium and Gallium. Composite 78 is positioned so that alignment pin 514 is positioned above locating hole 506. Composite 78 is preferably a matching electrode pair precursor, such as the composite shown in step 130 of WO99/13562 or U.S. Pat. No. 6,417,060, or is more preferably the composite depicted in FIG. 4 (see also the Example), in which a layer of titanium 72 is deposited on substrate 70, and a layer of silver 74 is further deposited on the layer of titanium. A further layer of copper 76 is grown electrochemically on the layer of silver. Alignment pin 514, which is pre-machined, is placed on the composite near the end of the electrolytic growth phase; this results in its attachment to the layer of copper 76. The diameter of the alignment pin is the same as the diameter of the locating hole.

In step 520, the polished silicon periphery of the composite 78 is contacted with the other polished end of the quartz tube 90; at the same time, the attachment pin seats in locating hole. During this step, substrate 502 is heated so that locating hole expands; when the assemblage is subsequently cooled, there is a tight fit between the alignment pin and the locating hole. High pressure is applied to this assemblage, which accelerates the chemical reaction between the polished silicon periphery of the composites and the polished ends of the quartz tube, bonding the polished surfaces to form the assemblage depicted in step 520.

In step 530, the assemblage is heated, and a signal applied to the quartz tube to cause the composite to open as shown, forming two electrodes, 72 and 74. In the deposition process, the adhesion of the silver and titanium is controlled so that when the electrode composite/quartz tube shown in FIG. 5 is heated, the electrode composite opens as shown, forming a pair of matching electrodes, 72 and 74. During the opening process, the tight fit between the alignment pin and the locating hole ensures that the electrodes 72 and 74 do not slide relative to one another.

Figure 6:
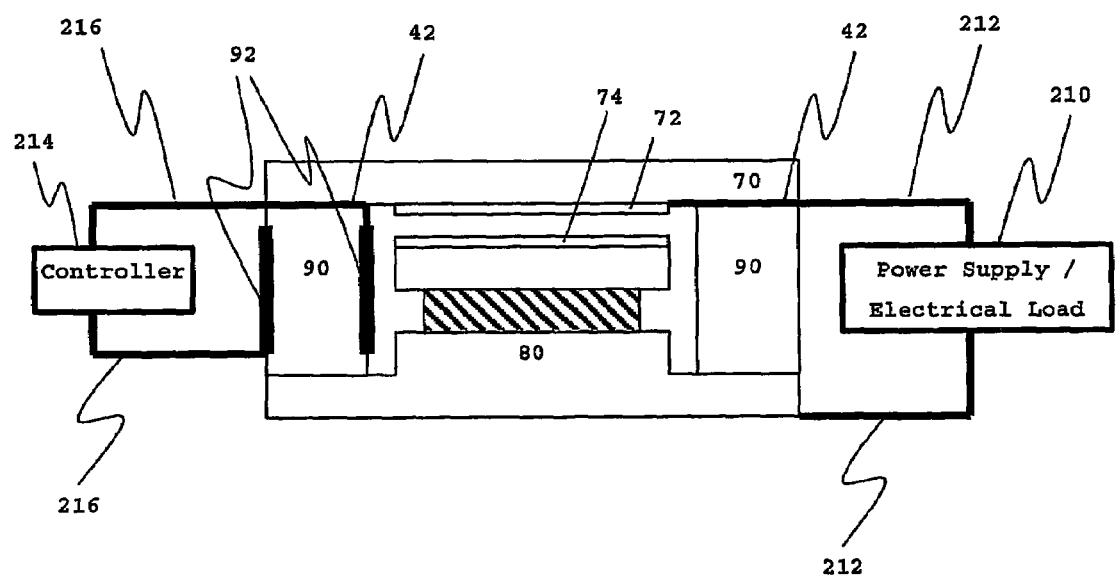
FIG. 6 is a diagrammatic representation of electrical connections to a diode device of the present invention.
Figure 7:
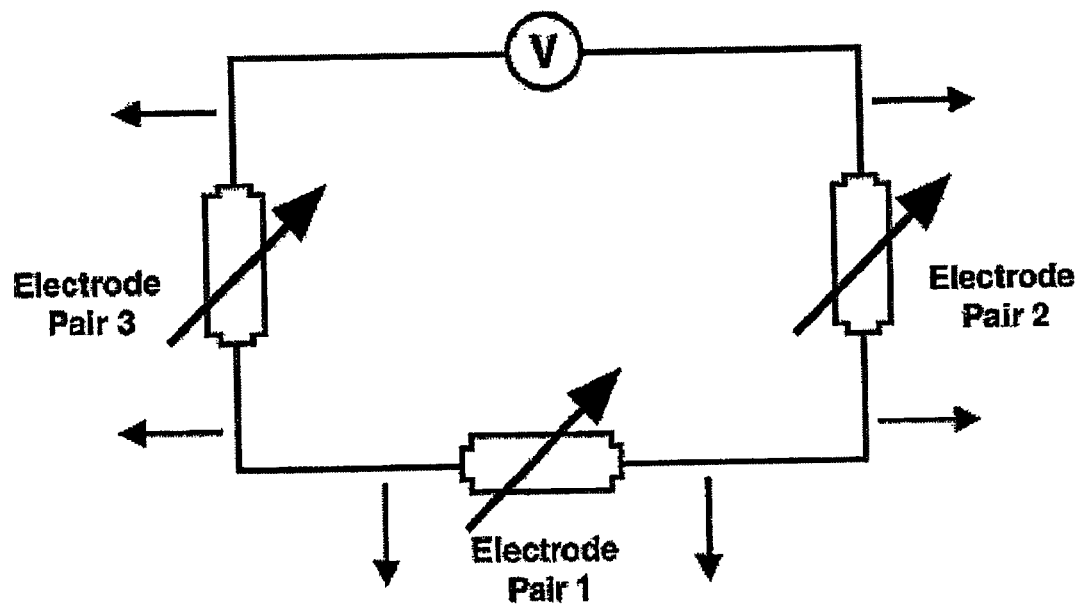
FIG. 7 is a diagrammatic representation of one embodiment of a circuit for controlling the signal applied to the actuating element.

Referring now to FIG. 6, which shows a schematic for the connection of controlling circuitry to the diode device shown in step 330 of FIG. 3, electrically conducting regions 42 are deposited on the surface of wafer 70 and Mo detail 80, and are joined by connecting wires 212 to a power supply/electrical load 27. Connectors 212 may be deposited prior to deposition of the layers depicted in FIG. 4, or they may be deposited after deposition of the layers depicted in FIG. 4 or they could be deposited from the other side of wafer depending on application. Electrically conducting regions 92 are also deposited on the curved surface of tubular actuator 90 and connected to a controller 214 by connecting wires 216. An electric field may be applied to the actuator tube 90, which causes it to expand or contract longitudinally, thereby altering the distance between electrodes 72 and 74. Electrodes 72 and 74 may be connected to a capacitance controller (not shown), which both modifies the actuator, and can give feedback to a power supply/electrical load to modify the heat pumping action, and generating action, respectively. In general, the magnitude of the voltage applied to the electrodes on the tubular actuating element will be chosen to compensate for tension in the diode components during positioning of the electrodes. In its simplest form, the circuit shown in FIG. 7 may control the voltage applied. A voltage source is connected with three resistors in series. The voltage drop across the resistors is applied to the electrode pairs. When the resistors have the same resistance, then an equal voltage will be applied to all three electrodes, and any variation in the potential of the source will be applied to all three electrode pairs symmetrically and will regulate distance between electrodes without changing angle between electrodes. If the potential of the source is maintained at a constant value, a decrease in the value of one of the resistors will lead to a rise in the voltage across the other two. This will smoothly change the angle between electrodes without introduction of tension in the electrode.

The diode element shown at step 330 of FIG. 3 or at step 530 of FIG. 5 can be used as a thermionic device and/or as a tunneling device, and can be used to function as a Power Chip and/or as a Cool Chip.

When considering a Gap Diode wherein the two electrodes are close enough to one another to allow for electron tunneling to occur, thermal expansion considerations are quite important. If thermal expansion is not taken into account, then the two electrodes could touch, causing the device to fail. The present invention discloses that if the cold side of the Gap Diode has a thermal expansion coefficient larger than that of the hot side, then the risk of touching is minimized. A preferred embodiment for this selection process, depending on the design temperature ratios of the device, is that the cold side should have a thermal expansion coefficient, which is a multiple of the hot side. Specific embodiments include the use of aluminum on the cold side and Si on the hot side. The thermal expansion coefficient of aluminum is 6 times that of Si, and it is disclosed that these two materials form the electrodes, when combined with the electrode matching invention shown in WO99/13562 and U.S. Pat. No. 6,417,060, and will tolerate a difference in temperature between the two sides of up to 500 degrees Kelvin.

The essence of the present invention are Power Chips and Cool Chips, utilizing a Gap Diode, in which the separation of the electrodes is set and controlled using piezo-electrice positioning elements.

A particular advantage of the diode element shown at step 330 of FIG. 3 or at step 530 of FIG. 5 is that the device has an outside surface that is Si, Sio2 (quartz) and metal. This allows additional circuitry (for example for control) to be laid down on the same Si wafer that serves as one of the electrodes. Additionally, a heat sink may be attached directly to the Si using techniques well known in chip fabrication.

EXAMPLE

Figure 4:
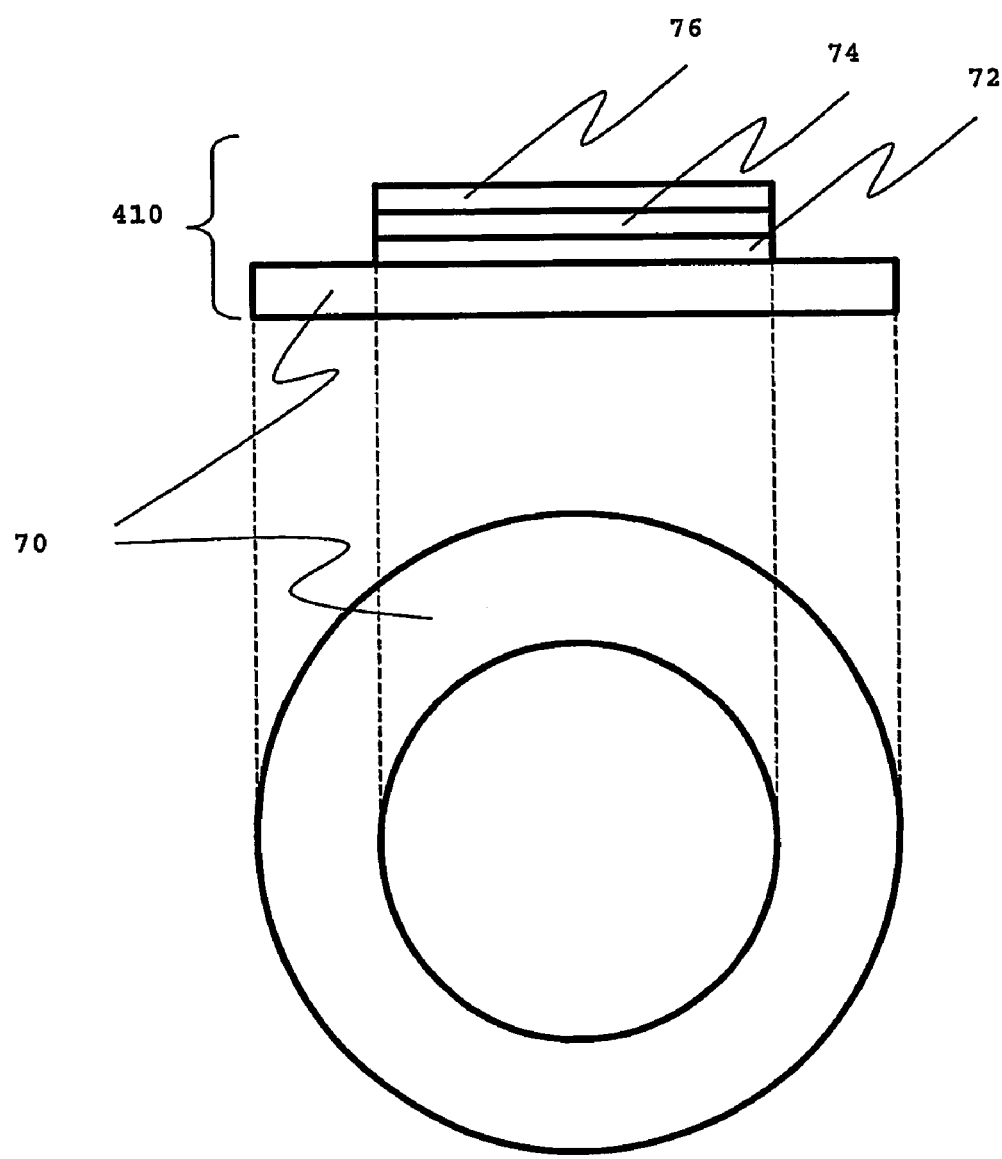
FIG. 4 is a diagrammatic representation of an electrode composite on a silicon wafer.

Referring to FIG. 4, which shows a composite intermediate 410, a doped silicon wafer is used as the substrate. The dopant is n type, and the conductivity of the doped silicon is on the order of 0.05 Ohm cm. A 0.1 μm thick titanium film is deposited over the silicon substrate using DC magnetron sputtering method. A round metallic mask with a diameter of 28 mm is used for the titanium film deposition. After deposition, the titanium is backed with silicon to achieve maximum adhesion of the titanium film to the silicon substrate. Next is the in situ deposition of 1 μm thick silver film using the same method. Deposition regimes for silver are chosen to achieve optimum adhesion of silver to the titanium film. (The optimum adhesion is much less than the adhesion usually used in microelectronics processes.) A layer of copper 500 μm thick is grown electrochemically on the silver film. The copper is grown using ordinary electrochemical growth.

Next, the sandwich on the border of titanium and silver films is opened. Once we have low adhesion between the titanium and silver films, the sandwich opens without considerable deformation of the electrodes. In this way, two conformal electrodes are fabricated. With conformal electrodes it is then possible to achieve tunneling currents over broad areas of the electrodes.

The process uses metallic masks to define the shape of the films to avoid exposing the samples to the atmosphere. This simplifies sample preparation and avoids problems connected with the cleaning of the electrode surfaces.

The sandwich is opened after the sandwich is placed in a sealed area and it is pumped down. By not exposing the electrode surfaces to the atmosphere, oxidation is avoided. The sandwich is opened by cooling it down in a vacuum from room temperature to approximately 0° C. or heating it up to 40° C. Because copper and silicon have different Thermal Expansion Coefficients (TEC) the two electrodes separate in the process of cooling or heating. If the adhesion between the titanium and silver films is low enough, the sandwich opens without leaving considerable deformation in the electrodes. On the other hand, the adhesion of silver to titanium must be high enough to prevent electrochemical liquid from entering between the films during the electrochemical growth of copper. Precise adhesion control between the titanium and silver films is therefore important.

Although the above specification contains many specificities, these should not be construed as limiting the scope of the invention but as merely providing illustrations of some of the presently preferred embodiments of this invention.

Such actuators, which this invention believes are necessary for accurate separation between the electrodes of any tunneling Power Chip or tunneling Cool Chip, do not need to be active once the device has been manufactured. For small temperature variations, it is conceivable that the capacitance loop and power supply for the actuators themselves will not be necessary, and the electrodes can be locked into place in the manufacturing or packaging process. Thus, in operation the actuators would not be necessary, as the gap would not be compromised with smaller temperature fluctuations.

In the above specification, capacitance is used to measure the distance between the electrodes. Other methods known in the art may be used, including measuring the tunneling current and optical interferometry. The generated current produced by a thermionic, thermotunneling or photoelectric Power Chip may also be measured to assess the separation of the electrodes. Other properties which may be measured include heat, for example the temperature of one or both of the electrodes may be used to initiate programmed actuation of the piezo-electric elements. The position of the electrodes may also be set according to the length of time the device has been in operation. Thus it may be envisaged that the electrodes are set at a certain distance when the device is first turned on, and then the positioning of the electrodes is adjusted after certain predetermined time intervals.

In addition, if the inter-converters are constructed using micro-machining techniques, the controlling circuitry for the separation of the electrodes may be deposited on the surface of the wafer next to the piezo-electric actuators.

The devices of the present invention may be constructed as MicroElectroMechanicalSystems (MEMS) devices using micro-machining of an appropriate substrate. Integrated circuit techniques and very large scale integration techniques for forming electrode surfaces on an appropriate substrate may also be used to fabricate the devices. Other approaches useful in the construction of these devices include vapor deposition, fluid deposition, electrolytic deposition, printing, silkscreen printing, airbrushing, and solution plating.

INDUSTRIAL APPLICABILITY

Devices made according to the present invention may be used in diode devices, vacuum diode devices, heat pumps, any other devices that are based on tunneling effects, and the like.

While this invention has been described with reference to numerous embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

The invention claimed is:

1. A method for fabricating a diode device comprising:
a housing means; a first electrode attached to one end of said housing means; a second electrode attached to an opposing end of said housing means; an electrical circuit connected to said electrodes; a further pair of electrodes attached to an inner and outer face of said housing means and attached to controlling circuitry whereby a length of said housing means may be modified by a signal applied to said further pair of electrodes; and wherein said housing means is able to adjust the magnitude of a distance separating said electrodes;
comprising the steps:
(a) contacting a first composite to one end of a tubular actuating element;
(b) introducing an electrically conducting material to an inner surface of said composite;
(c) contacting a second composite to the other end of the tubular actuating element, wherein said composite is a matching electrode pair precursor comprising a silicon wafer, a layer of titanium, a layer of silver and a layer of copper, such that an inner surface of said second composite is also in contact with the electrically conducting material;
(d) sealing the contact between the first composite and the tubular element, and between the second composite and the tubular element;
(e) separating the second composite along a boundary between two different layers and forming two matching electrodes.

2. The method of claim 1 wherein step (c) additionally comprises seating an alignment pin on said second composite into a locating hole on said first composite.

3. The method of claim 1 wherein said second composite is fabricated according to the steps:
(a) polishing at least a region around the periphery of a silicon wafer;
(b) depositing a first layer on said silicon wafer;
(c) depositing a second layer on said first layer;
(d) forming a third layer on said second layer.

4. The method of claim 3 wherein said first layer comprises titanium.

5. The method of claim 3 wherein said second layer comprises silver.

6. The method of claim 3 wherein said third layer comprises copper.

7. The method of claim 6 wherein the method for forming said third layer of copper comprises electrolytic growth of copper.

8. The method of claim 6 additionally comprising the step of:
(a) attaching an alignment pin to said third layer.

9. The method of claim 8 wherein said attaching step comprises:

(a) contacting said alignment pin with said third layer;
(b) electrolytically growing copper from said third layer around the alignment pin.

10. The method of claim 1 wherein said first composite comprises molybdenum.

11. The method of claim 1 wherein said electrically conducting material comprises silver paste.

12. The method of claim 1 wherein said electrically conducting material comprises liquid metal.

13. The method of claim 12 wherein said liquid metal comprises gallium and indium.

* * * * *